Dec. 26, 1961 W. E. SHEEHAN 3,015,076

AUTOMATIC GAIN CONTROL SYSTEMS

Filed Sept. 4, 1958 2 Sheets-Sheet 1

INVENTOR.
WILLIAM E. SHEEHAN

BY H. Vincent Harsha

ATTORNEY

Dec. 26, 1961 W. E. SHEEHAN 3,015,076

AUTOMATIC GAIN CONTROL SYSTEMS

Filed Sept. 4, 1958 2 Sheets-Sheet 2

INVENTOR.
WILLIAM E. SHEEHAN
BY W. Vincent Harsha
ATTORNEY 3,015,076
Patented Dec. 26, 1961

3,015,076

AUTOMATIC GAIN CONTROL SYSTEMS

William E. Sheehan, Brighton, Mass., assignor to Raytheon Company, a corporation of Delaware Filed Sept. 4, 1958, Ser. No. 758,945
2 Claims. (Cl. 330—22)

The present invention relates generally to signal amplifying circuits, and more particularly to amplifiers of the type utilizing semi-conductor devices such as transistors as signal amplifying devices. Specifically, this invention relates to transistor amplifier systems incorporating automatic gain control (AGC) circuits.

In certain circuit applications an amplifier must be used to amplify very weak signals and yet be able to give approximately the same undistorted output under very strong signal inputs. In such applications either some system of attenuation must be used when strong signals are present, or the gain of the amplifier must be reduced to compensate for the strong signal input. The present invention provides an automatic gain control circuit for transistor amplifiers which permits a wide range of input voltages to be applied to the first stage of a high gain cascade amplifier without overload of any stage of the amplifier.

Automatic gain control for a transistor signal amplifier has been accomplished in various ways in the prior art. For example, a signal responsive voltage or current has been applied to the emitter or base electrodes of one or more transistor amplifiers to control their gain inversely with signal strength. One of the problems introduced by the application of this type AGC is that the transistor's input resistance varies as their gain is controlled in the desired manner. These input resistance variations may vary the loading on the coupling circuits of the amplifier and hence the frequency response of the amplifier, producing undesired distortion. Ideally, the frequency response of such amplifying circuits should be flat over a rather wide band of frequencies.

One consideration of extreme importance in a transistor amplifier system is the fact that the majority of transistors are essentially small signal devices, achieving amplification by current gain rather than by voltage gain. Input signal levels must be kept low to avoid overloading and consequent distortion and non-linearities.

Accordingly, it is a principal object of the present invention to provide an improved transistor signal amplifier capable of handling large input signal voltages without overloading.

A further object of the present invention is to provide an AGC circuit for transistor amplifiers which utilizes a plurality of gain control channels to achieve substantially constant undistorted output levels over a wide range of input voltage levels.

An additional object of the present invention is to provide an AGC circuit for transistor signal amplifiers wherein a substantially constant gain is achieved over the frequency band at which the amplifier operates with variations in the magnitude of the input signal.

It is another object of the present invention to provide improved transistor signal amplifying circuits of the type referred to wherein variations in the output level due to the application of large magnitude input signals are faithfully reproduced without overloading or distortion. AGC potentials are applied to the signal amplifying circuits to substantially eliminate distortion.

It is the further object of the present invention to provide means in signal amplifying circuits of the type employing transistors as active signal amplifying elements wherein a substantially uniform frequency response and distortion-free circuit operation are achieved with changes in loading due to the application of input signals of varying magnitude which produce an AGC signal of varying magnitude which is applied to the transistors.

The novel features which are considered characteristic of this invention are set forth with particularity in the appended claims. The invention itself, however, both as to its organization and method of operation, as well as additional objects and advantages thereof, will best be understood from the following description together with the accompanying drawings, wherein:

Figure 1:
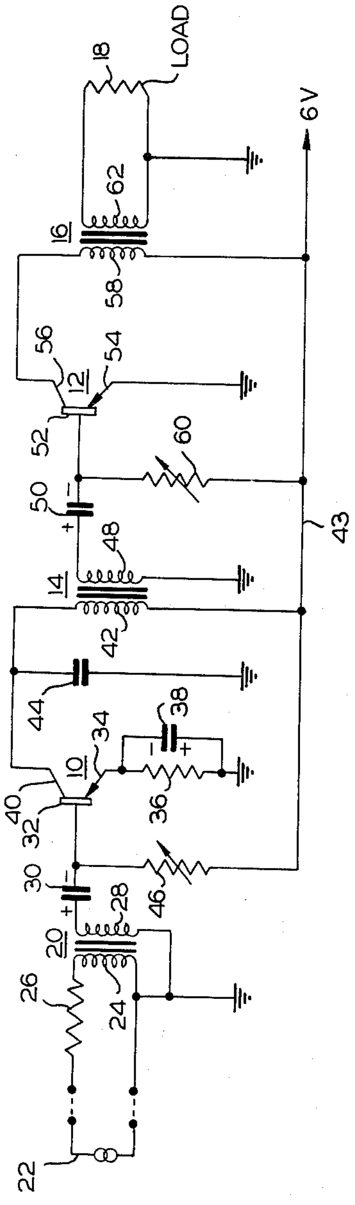
FIGURE 1 is a schematic circuit diagram of a two stage amplifier without AGC circuits.

In the amplifier of FIGURE 1, a first or input amplifying stage including transistor device 10 is coupled to drive a second or output amplifying stage including transistor 12 by means of an interstage transformer 14. Output transformer 16 couples the second transistor to the load device, which is represented by the resistor 18. An input transformer 20 serves to couple an input signal to transistor 10. Element 22 represents the source of the input signal, which signal may vary over a wide range of voltage magnitude as described more fully hereafter.

The input signal from source 22 is applied to primary 24 of the input transformer by way of resistor 26 which provides isolation and current limiting functions. Transformer 20 is an impedance matching device, and the signal voltage from the secondary winding 28 is coupled to the base 32 of transistor 10 by way of coupling capacitor 30. This transistor stage is connected in the so-called "grounded emitter" configuration; also known to those skilled in the art as a common emitter configuration. Emitter 34 is connected to ground by resistor 36, and a condenser 38 is shunted across this resistor.

The load for collector 40 is the primary 42 of interstage transformer 14. A source of negative potential from wire 43 is applied to the collector by way of this transformer winding, and a decoupling condenser 44 is connected from collector 40 to ground. Bias voltage for the transistor base 32 is also taken from wire 43 and is applied to the base by way of variable resistor 46.

The signal from secondary winding 48 of the interstage transformer is coupled to the base 52 of the second transistor amplifier stage 12 by way of coupling capacitor 50. The emitter electrode 54 is connected directly to ground, and the collector electrode 56 is connected to one end of primary winding 58 of output transformer 16. The other end of winding 58 connects to the source of negative potential at wire 43. Load 18 is connected directly across the secondary winding 62 of the output transformer. One side of winding 62 may be grounded, as shown.

Figure 2:
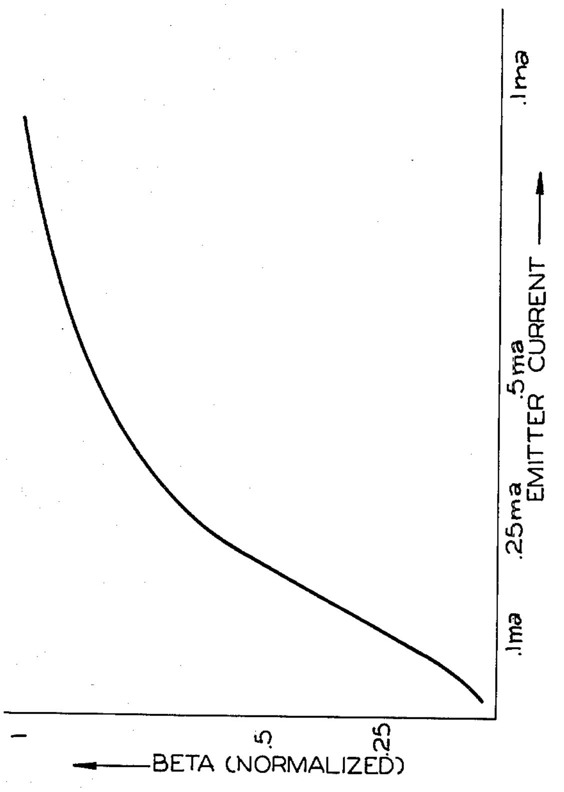
FIGURE 2 is a plot of current gain for a transistor device which will aid in an understanding of the present invention.

Let us now look at the basic principle involved in most transistor AGC systems. FIGURE 2 shows a plot of beta vs. $I_e$ for a typical transistor. As the emitter current is reduced below a certain critical value the base to collector current gain (beta) of the transistor begins to fall off. The further the emitter current is reduced, the less beta becomes. Also, as the emitter current is decreased, both the input and output impedances of the transistor increase, and if the circuit impedances were originally matched to the transistor impedances, the resulting mismatch causes a loss in gain. The loss in gain due to reduced emitter current becomes appreciable when the emitter current falls below 100 $\mu$a., and if the current is reduced to 25 or 30 $\mu$a., there is little or no gain in the circuit.

Although this method of gain reduction works quite well for small signals, it is quite deficient in its ability to handle large signals, since the D.C. base to emitter voltage is quite small when the transistor is nearly cutoff. This is the most serious limitation to any AGC-ed transistor amplifier. To restate the problem, a transistor's signal handling ability, referred to the input, becomes smaller rather than greater, when it is AGC-ed. This is the opposite situation to that encountered with remote cut-off tubes.

By way of example, a two stage transistor amplifier constructed in accordance with the schematic diagram of FIGURE 1, has a power output of only 40 milli-watts before distortion occurs due to overloading by reason of the magnitude of the applied input signal. In this particular amplifier the voltage required on base 32 of the first transistor stage 10 to reach this overload condition at the output load 18 was 0.03 volt. Total gain of the exemplary amplifier was 51.4 db, and the frequency bandwidth was 500 cycles to 11 kilocycles measured at the 3 db down points of the response curve. The most important factor, however, was that it required only 0.03 volt at the input base electrode 32 to overload this amplifier.

Figure 3:
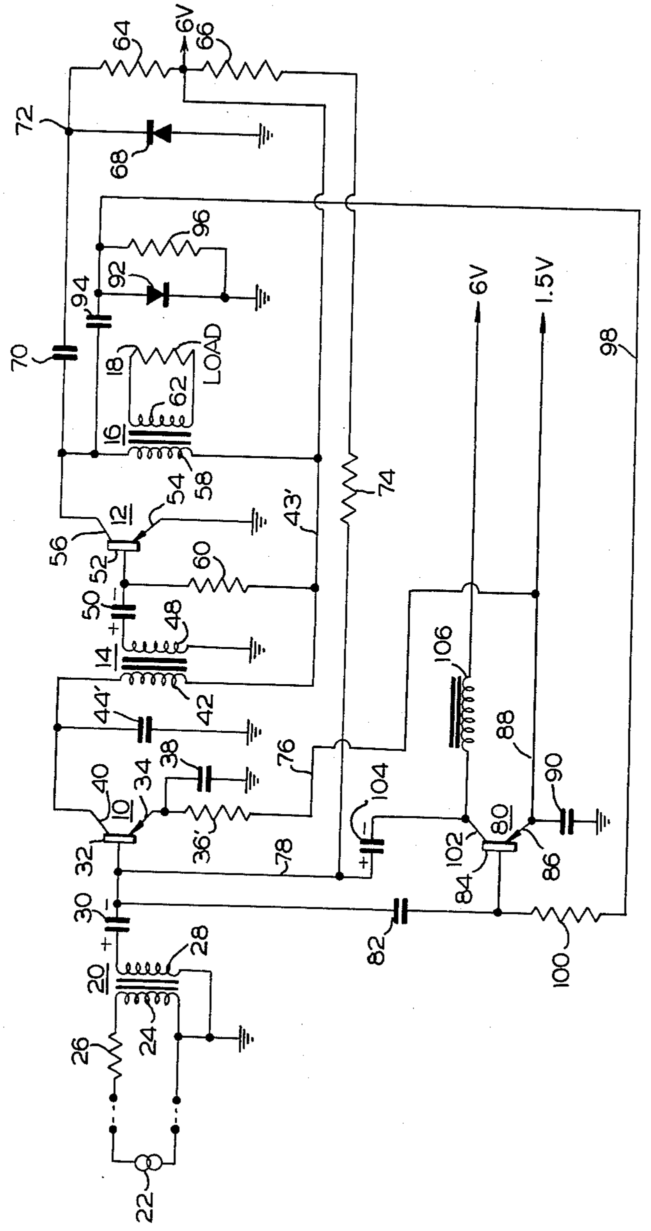
FIGURE 3 is a schematic circuit diagram of a transistor amplifier similar to that of FIGURE 1 including AGC circuits, according to a preferred embodiment of the invention.

FIGURE 3 shows the complete schematic of a two stage amplifier similar to that shown in FIGURE 1 to which has been added an AGC system which has two separate actions. Part of the AGC action is derived from regular emitter current control of the first amplifier stage, and the remainder of the AGC action is derived from a variable negative feedback amplifier. Let us consider these plural AGC actions of FIGURE 3 in detail. The basic amplifier is similar to that of FIGURE 1, and similar reference numerals have been applied to indicate identical elements in the two circuits. The connections of the basic two stage amplifier portion of FIGURE 3 will not be recited in detail, since this has already been set out for the circuit of FIGURE 1. It will be sufficient to note that an input signal from source 22 is amplified in the two stages including transistor devices 10 and 12, and the resultant output signal appears across the load 18.

Energizing potentials for the collector electrodes 40 and 56, and the bias potential for base electrode 52 of the second transistor stage, are taken from a wire 43′ which connects to a first source of negative potential indicated in the drawing as −6 volts in a manner similar to that shown in FIGURE 1. Bias for the base electrode 32 of transistor 10 is derived from a voltage network consisting of serially connected resistors 64 and 66, and a diode 68. The first source of negative potential is also connected to the junction point of resistors 64 and 66. The junction 72 of the free end of resistor 64 and the diode cathode is connected through condenser 70 to collector 56 of the output stage.

The anode of diode 68 is grounded so that in the presence of an output signal a positive voltage is built up at the junction 72. This positive voltage bucks the negative fixed bias voltage applied between resistors 64 and 66, and the resultant bias voltage at the lower end of resistor 66 is applied through resistor 74 and lead 78 to the base 32 of the first amplifier stage 10 to effectively reduce the bias thereon. Reduction of the bias causes the emitter current to go from 300 $\mu$a. to about 200 $\mu$a. or slightly less as shown on the curve of FIGURE 2. Changing the emitter current in this range causes the operating point to slide over the knee of the beta vs. $I_e$ curve and down into the low gain region, thus reducing the gain of the stage. This action in itself is sufficient for AGC in applications where the maximum input signal to the controlled first stage 10 is much smaller in magnitude than the base to emitter voltage. However, in cases where the input may range from a few millivolts up to several volts this action serves only to produce distortion, since the strong input voltage acts as though it were driving a class "B" stage. Therefore, some method is needed to keep the input voltage on the base of the first stage down to a reasonable level so that the above mentioned AGC action (due to reduced emitter current) would have effect. The feedback amplifier stage including transistor 80 achieves this effect.

The same input signal which is applied to base 32 of the first stage is also applied to the input base electrode 84 of the AGC feedback amplifier through coupling condenser 82. Emitter electrode 86 of the transistor 80 is grounded by way of condenser 90. This "grounded emitter" is biased from a second source of negative potential indicated in the drawing as −1.5 volts. Bias potential from this second source is also applied over a lead 76 to the emitter 34 of transistor 10 through the bias resistor 36′. Under small signal conditions where little AGC is required, the feedback amplifier is cut off, since its bias voltage on the base electrode 84 is derived from a second diode 92 which is connected to collector 56 of the output stage through condenser 94. Resistor 96 serves as the diode load, and the cathode is grounded so that a negative bias voltage is built up in the presence of output signals. This negative voltage is applied over lead 98 to bias the feedback transistor 80 and its magnitude is dependent upon the magnitude of the output voltage. The emitter 86 of the feedback amplifier is biased to −1.5 volts, so that the bias on base 84 must exceed this value before the feedback amplifier will conduct and provide the negative feedback AGC voltage. This action provides an effective delay.

The output load for collector 102 of the feedback transistor amplifier 80 is essentially its own input impedance together with the input impedance of the first amplifier stage in parallel, since the output from collector 102 is coupled through condenser 104 to base 32 of the first stage. Transistor 80 is connected in a "grounded emitter" configuration, and this common emitter arrangement provides a phase reversal between base electrode 84 and collector electrode 102. Thus the output from collector 102 is 180° out of phase with the input signal appearing across winding 28 of the input transformer. Thus the input voltage to the first stage is reduced in magnitude and is prevented from overloading the first stage. Since the feedback amplifier is also working on the beta vs. $I_e$ curve after it first begins conducting, its gain is dependent on the magnitude of the output voltage up to a point, after which it has relatively constant gain. Thus the feedback voltage comes on gradually, increasing in magnitude as it is needed. Of course, the input to the feedback amplifier is also reduced by the feedback voltage over lead 98 so that it prevents itself from overloading. In this way a wide range of input voltages can be accommodated without fear of overload.

A choke 106 is used in the collector circuit of the feedback amplifier principally to allow the feedback amplifier to have a greater dynamic range but also to prevent the feedback amplifier circuit from loading the input of the first amplifier stage too heavily when the feedback amplifier is cut-off. A resistor may be substituted for this choke with some degradation of performance.

In summary, two separate AGC channels are provided. One—the conventional type simply reduces the gain of the first stage in proportion to the magnitude of the output voltage. Second—a 180° out of phase feedback voltage is provided by means of a feedback amplifier which reduces the input voltage in proportion to the output. This feedback amplifier is provided with a delay so that the full gain of the amplifier may be utilized at low input levels.

A test amplifier constructed according to FIGURE 3 was capable of handling a range of input voltages up to about 10 volts R.M.S. on the primary side of the input transformer 20 which corresponds to about 4 volts at the base 32 of the first amplifier stage. There was some distortion evident at the higher input levels, but in general it was tolerable, particularly in view of the fact that the amplifier of FIGURE 1 would overload at 1/100 of the input voltage without this FIGURE 3 system of AGC.

Typical circuit element values as used in the test amplifiers constructed were as follows:

| | | |
|---|---|---|
| Transistor 10 | | 2N131 |
| Transistors 12 and 80 | | 2N132 |
| R–26, R–100 | ohms | 10K |
| R–36 | do | 1.8K |
| R–60 | do | 6.8K |
| R–64 | do | 120K |
| R–66, 96 | do | 150K |
| R–74 | do | 22K |
| C–30, C–38, C–50, C–82, C–90, C–104 | mfd | 20 |
| C–44, C–70 | do | 0.01 |
| C–44 | do | 0.001 |
| C–94 | do | 1 |

What is claimed is:

1. A gain control system for a transistor amplifier, said amplifier including a signal input channel, at least one variable gain transistor stage having a signal input circuit, a signal output circuit, and means coupling a signal from the input channel into the signal input circuit of the transistor stage, comprising, in combination, first means for varying the gain of said transistor stage in response to the magnitude of the output signal of said output circuit, second means for controlling the magnitude of the signal coupled into said signal input circuit in response to the magnitude of an amplified signal in the output circuit of said transistor stage, said second means comprising a transistor variable gain signal inverter, capacitive means coupling the input of said inverter to said signal input channel, capacitive means coupling the output of said inverter to the same point on said signal input circuit of the transistor stage to control the effective impedance between said signal input channel and a point of reference potential, means connected between the transistor stage output circuit and the inverter input for varying the gain of the inverter in response to an amplified signal in the transistor amplifying stage output circuit, said means for varying the gain of the inverter including rectifier means for producing a D.C. output proportional to the magnitude of the amplified output signal, and biasing means connected to said inverter and operative to bias said inverter to a cut-off condition for magnitudes of said D.C. output below a predetermined value, but being ineffective to retain said inverter in a cut-off condition when said D.C. output exceeds said predetermined value whereby under small signal input conditions to said signal input circuit said inverter is cut off, but under large signal input conditions to said signal input circuit said inverter is operative to provide a negative feedback signal to said amplifying stage.

2. A gain control system for a signal amplifier, said amplifier including a signal input channel, at least one variable gain amplifying stage having a signal input circuit, a signal output circuit, and means coupling a signal from the input channel into the signal input circuit of the amplifying stage, comprising, in combination, first means for varying the gain of said amplifying stage in response to the magnitude of the output signal of said output circuit, second means for controlling the magnitude of the signal coupled into said signal input circuit in response to the magnitude of an amplified signal in the output circuit of said amplifying stage, said second means comprising a variable gain signal inverter, capacative means coupling the input of said inverter to said signal input channel, capacitive means coupling the output of said inverter to the same point on said signal input circuit of the amplifying stage to control the effective impedance between said signal input channel and a point of reference potential, means connected between the amplifying stage output circuit and the inverter input for varying the gain of the inverter in response to an amplified signal in the amplifying stage output circuit, said means for varying the gain of the inverter including rectifier means for producing a D.C. output proportional to the magnitude of the amplified output signal, and biasing means connected to said inverter and operative to bias said inverter to a cut-off condition for magnitudes of said D.C. output below a predetermined value, but being ineffective to retain said inverter in a cut-off condition when said D.C. output exceeds said predetermined value whereby under small signal input conditions to said signal input circuit said inverter is cut off, but under large signal input conditions to said signal input circuit said inverter is operative to provide a negative feedback signal to said amplifying stage.

References Cited in the file of this patent

UNITED STATES PATENTS

| | | |
|---|---|---|
| 2,148,030 | McLennan | Feb. 21, 1939 |
| 2,428,039 | Royden | Sept. 30, 1947 |
| 2,747,028 | Clark | May 26, 1956 |
| 2,760,008 | Schade | Aug. 21, 1956 |
| 2.891,145 | Bradmiller | June 16, 1959 |